United States Patent
Leamon (12)

(10) Patent No.: US 8,859,035 B1
(45) Date of Patent: Oct. 14, 2014

(54) POWDER TREATMENT FOR ENHANCED FLOWABILITY

(75) Inventor: David Leamon, Gilbert, AZ (US)

(73) Assignee: SDCmaterials, Inc., Tempe, AZ (US)

( * ) Notice: Subject to any disclaimer, the term of this patent is extended or adjusted under 35 U.S.C. 154(b) by 821 days.

(21) Appl. No.: 12/962,463

(22) Filed: Dec. 7, 2010

Related U.S. Application Data

(60) Provisional application No. 61/284,329, filed on Dec. 15, 2009.

(51) Int. Cl.
| | | |
|---|---|---|
| *B05D 7/00* | (2006.01) | |
| *B05D 1/02* | (2006.01) | |
| *B05D 1/08* | (2006.01) | |
| *H05H 1/26* | (2006.01) | |
| *B05D 3/00* | (2006.01) | |
| *H05H 1/00* | (2006.01) | |
| *H05H 1/32* | (2006.01) | |
| *H05H 1/48* | (2006.01) | |

(52) U.S. Cl.
USPC ........... 427/212; 427/447; 427/449; 427/452; 427/446; 427/532; 427/535; 427/540; 427/580; 427/570; 427/569

(58) Field of Classification Search
CPC ............ H05H 1/24; H05H 1/42; H05H 1/48; B01J 37/349; C23C 4/00; C23C 4/127; B05D 1/62; B05D 3/141
USPC ......... 427/446, 447, 449, 452, 569, 535, 540, 427/580, 212–225, 532, 570
See application file for complete search history.

(56) References Cited

U.S. PATENT DOCUMENTS

| 2,021,936 A | 11/1935 | Johnstone |
| 2,284,554 A | 5/1942 | Beyerstedt ..................... 196/10 |
| 2,419,042 A | 4/1947 | Todd .............................. 202/205 |
| 2,519,531 A | 8/1950 | Worn .............................. 230/95 |
| 2,562,753 A | 7/1951 | Trost .............................. 241/39 |
| 2,689,780 A | 9/1954 | Rice ............................... 23/106 |
| 3,001,402 A | 9/1961 | Koblin ......................... 73/421.5 |

(Continued)

FOREIGN PATENT DOCUMENTS

| DE | 34 45 273 A1 | 6/1986 |
| EP | 1134302 | * 9/2001 |

(Continued)

OTHER PUBLICATIONS

"Plasma Spray and Wire Flame Spray Product Group", Process Materials, 2009, p. 1-2.*

(Continued)

*Primary Examiner* — Timothy Meeks
*Assistant Examiner* — Ann Disarro
(74) *Attorney, Agent, or Firm* — Morrison & Foerster LLP

(57) ABSTRACT

A method of enhancing the flowability of a powder. The powder is defined by a plurality of particles having an initial level of inter-particle forces between each particle. The method comprises: treating the powder, wherein the level of inter-particle forces between each particle is substantially decreased from the initial level; fluidizing the treated powder; flowing the treated powder into a plasma arc chamber; the plasma arc chamber generating a plasma arc; and the plasma arc chamber operating on the treated powder using the generated plasma arc. Preferably, the inter-particle forces are decreased by coating the particles with an organic surfactant.

27 Claims, 2 Drawing Sheets

(56) References Cited

U.S. PATENT DOCUMENTS

| | | | |
|---|---|---|---|
| 3,042,511 A | 7/1962 | Reding, Jr. | |
| 3,067,025 A | 12/1962 | Chisholm | 75/84.5 |
| 3,145,287 A | 8/1964 | Siebein et al. | |
| 3,178,121 A | 4/1965 | Wallace, Jr. | 241/5 |
| 3,179,782 A | 4/1965 | Matvay | |
| 3,181,947 A | 5/1965 | Vordahl | |
| 3,235,700 A | 2/1966 | Mondain-Monval et al. | |
| 3,313,908 A | 4/1967 | Unger et al. | |
| 3,401,465 A | 9/1968 | Larwill | 34/57 |
| 3,450,926 A | 6/1969 | Kiernan | 313/231 |
| 3,457,788 A | 7/1969 | Miyajima | 73/422 |
| 3,537,513 A | 11/1970 | Austin | 165/70 |
| 3,552,653 A | 1/1971 | Inoue | |
| 3,617,358 A | 11/1971 | Dittrich | |
| 3,667,111 A | 6/1972 | Chartet | |
| 3,741,001 A | 6/1973 | Fletcher et al. | 73/28 |
| 3,752,172 A | 8/1973 | Cohen et al. | 137/12 |
| 3,761,360 A | 9/1973 | Auvil et al. | |
| 3,774,442 A | 11/1973 | Gustavsson | 73/28 |
| 3,804,034 A | 4/1974 | Stiglich, Jr. | |
| 3,830,756 A | 8/1974 | Sanchez et al. | |
| 3,871,448 A | 3/1975 | Vann et al. | |
| 3,892,882 A | 7/1975 | Guest et al. | 427/34 |
| 3,914,573 A | 10/1975 | Muehlberger | 219/76 |
| 3,959,094 A | 5/1976 | Steinberg | |
| 3,959,420 A | 5/1976 | Geddes et al. | 261/112 |
| 3,969,482 A | 7/1976 | Teller | |
| 4,008,620 A | 2/1977 | Narato et al. | 73/421.5 A |
| 4,018,388 A | 4/1977 | Andrews | 241/39 |
| 4,021,021 A | 5/1977 | Hall et al. | |
| 4,127,760 A | 11/1978 | Meyer et al. | |
| 4,139,497 A | 2/1979 | Castor et al. | 252/470 |
| 4,146,654 A | 3/1979 | Guyonnet | |
| 4,157,316 A | 6/1979 | Thompson et al. | |
| 4,171,288 A | 10/1979 | Keith et al. | 252/462 |
| 4,174,298 A | 11/1979 | Antos | |
| 4,189,925 A | 2/1980 | Long | |
| 4,227,928 A | 10/1980 | Wang | |
| 4,248,387 A | 2/1981 | Andrews | 241/5 |
| 4,253,917 A | 3/1981 | Wang | |
| 4,260,649 A | 4/1981 | Dension et al. | |
| 4,284,609 A | 8/1981 | deVries | 423/242 |
| 4,315,874 A | 2/1982 | Ushida et al. | |
| 4,326,492 A | 4/1982 | Leibrand, Sr. et al. | |
| 4,344,779 A | 8/1982 | Isserlis | |
| 4,369,167 A | 1/1983 | Weir | |
| 4,388,274 A | 6/1983 | Rourke et al. | 422/177 |
| 4,419,331 A | 12/1983 | Montalvo | |
| 4,431,750 A | 2/1984 | McGinnis et al. | |
| 4,436,075 A | 3/1984 | Campbell et al. | 123/557 |
| 4,440,733 A | 4/1984 | Lawson et al. | |
| 4,458,138 A | 7/1984 | Adrian et al. | |
| 4,459,327 A | 7/1984 | Wang | |
| 4,505,945 A | 3/1985 | Dubust et al. | |
| 4,513,149 A | 4/1985 | Gray et al. | 564/449 |
| 4,523,981 A | 6/1985 | Ang et al. | |
| 4,545,872 A | 10/1985 | Sammells et al. | |
| RE32,244 E | 9/1986 | Andersen | |
| 4,609,441 A | 9/1986 | Frese, Jr. et al. | |
| 4,610,857 A | 9/1986 | Ogawa et al. | |
| 4,616,779 A | 10/1986 | Serrano et al. | |
| 4,723,589 A | 2/1988 | Iyer et al. | |
| 4,731,517 A | 3/1988 | Cheney | |
| 4,751,021 A | 6/1988 | Mollon et al. | |
| 4,764,283 A | 8/1988 | Ashbrook et al. | 210/695 |
| 4,765,805 A | 8/1988 | Wahl et al. | |
| 4,824,624 A | 4/1989 | Palicka et al. | 264/67 |
| 4,836,084 A | 6/1989 | Vogelesang et al. | |
| 4,855,505 A | 8/1989 | Koll | 564/398 |
| 4,866,240 A | 9/1989 | Webber | 219/121.47 |
| 4,877,937 A | 10/1989 | Müller | |
| 4,885,038 A | 12/1989 | Anderson et al. | |
| 4,921,586 A | 5/1990 | Molter | |
| 4,970,364 A | 11/1990 | Müller | |
| 4,983,555 A | 1/1991 | Roy et al. | 501/120 |
| 4,987,033 A | 1/1991 | Abkowitz et al. | 428/469 |
| 5,006,163 A | 4/1991 | Benn et al. | |
| 5,015,863 A | 5/1991 | Takeshima et al. | |
| 5,041,713 A | 8/1991 | Weidman | 219/121.51 |
| 5,043,548 A | 8/1991 | Whitney et al. | 219/121.84 |
| 5,070,064 A | 12/1991 | Hsu et al. | |
| 5,073,193 A | 12/1991 | Chaklader et al. | 75/346 |
| 5,133,190 A | 7/1992 | Abdelmalek | |
| 5,151,296 A | 9/1992 | Tokunaga | |
| 5,157,007 A | 10/1992 | Domesle et al. | |
| 5,192,130 A | 3/1993 | Endo et al. | |
| 5,217,746 A | 6/1993 | Lenling et al. | |
| 5,230,844 A | 7/1993 | Macaire et al. | |
| 5,233,153 A | 8/1993 | Coats | |
| 5,269,848 A | 12/1993 | Nakagawa | |
| 5,294,242 A | 3/1994 | Zurecki et al. | |
| 5,330,945 A | 7/1994 | Beckmeyer et al. | |
| 5,338,716 A | 8/1994 | Triplett et al. | |
| 5,369,241 A | 11/1994 | Taylor et al. | 219/121.47 |
| 5,371,049 A | 12/1994 | Moffett et al. | 501/89 |
| 5,372,629 A | 12/1994 | Anderson et al. | 75/332 |
| 5,392,797 A | 2/1995 | Welch | 134/108 |
| 5,436,080 A | 7/1995 | Inoue et al. | |
| 5,439,865 A | 8/1995 | Abe et al. | 502/333 |
| 5,442,153 A | 8/1995 | Marantz et al. | 219/121.47 |
| 5,452,854 A | 9/1995 | Keller | |
| 5,460,701 A | 10/1995 | Parker et al. | |
| 5,464,458 A | 11/1995 | Yamamoto | |
| 5,485,941 A | 1/1996 | Guyomard et al. | 222/1 |
| 5,486,675 A | 1/1996 | Taylor et al. | |
| 5,534,149 A | 7/1996 | Birkenbeil et al. | 210/636 |
| 5,534,270 A | 7/1996 | De Castro | |
| 5,543,173 A * | 8/1996 | Horn et al. | 427/212 |
| 5,553,507 A | 9/1996 | Basch et al. | 73/863.01 |
| 5,562,966 A | 10/1996 | Clarke et al. | |
| 5,582,807 A | 12/1996 | Liao et al. | |
| 5,596,973 A | 1/1997 | Grice | |
| 5,611,896 A | 3/1997 | Swanepoel et al. | 204/169 |
| 5,630,322 A | 5/1997 | Heilmann et al. | 62/95 |
| 5,652,304 A | 7/1997 | Calderon et al. | |
| 5,714,644 A | 2/1998 | Irgang et al. | |
| 5,723,027 A | 3/1998 | Serole | |
| 5,723,187 A | 3/1998 | Popoola et al. | |
| 5,726,414 A | 3/1998 | Kitahashi et al. | |
| 5,733,662 A | 3/1998 | Bogachek | |
| 5,749,938 A | 5/1998 | Coombs | 75/332 |
| 5,776,359 A | 7/1998 | Schultz et al. | 252/62.51 |
| 5,788,738 A | 8/1998 | Pirzada et al. | 75/331 |
| 5,804,155 A | 9/1998 | Farrauto et al. | |
| 5,811,187 A | 9/1998 | Anderson et al. | 428/403 |
| 5,837,959 A | 11/1998 | Muehlberger et al. | 219/121.47 |
| 5,851,507 A | 12/1998 | Pirzada et al. | 423/659 |
| 5,853,815 A | 12/1998 | Muehlberger | 427/446 |
| 5,858,470 A | 1/1999 | Bernecki et al. | |
| 5,884,473 A | 3/1999 | Noda et al. | |
| 5,905,000 A | 5/1999 | Yadav et al. | 429/33 |
| 5,928,806 A | 7/1999 | Olah et al. | |
| 5,935,293 A | 8/1999 | Detering et al. | 75/10.29 |
| 5,973,289 A | 10/1999 | Read et al. | |
| 5,989,648 A | 11/1999 | Phillips | 427/456 |
| 5,993,967 A | 11/1999 | Brotzman, Jr. et al. | 428/407 |
| 5,993,988 A | 11/1999 | Ohara et al. | 429/40 |
| 6,004,620 A | 12/1999 | Camm | |
| 6,012,647 A | 1/2000 | Ruta et al. | 239/132.1 |
| 6,033,781 A | 3/2000 | Brotzman, Jr. et al. | 428/405 |
| 6,045,765 A | 4/2000 | Nakatsuji et al. | |
| 6,059,853 A | 5/2000 | Coombs | 75/332 |
| 6,066,587 A | 5/2000 | Kurokawa et al. | |
| 6,084,197 A | 7/2000 | Fusaro, Jr. | |
| 6,093,306 A | 7/2000 | Hanrahan et al. | |
| 6,093,378 A | 7/2000 | Deeba et al. | |
| 6,102,106 A | 8/2000 | Manning et al. | 165/76 |
| 6,117,376 A | 9/2000 | Merkel | |
| 6,140,539 A | 10/2000 | Sander et al. | |
| 6,168,694 B1 | 1/2001 | Huang et al. | |
| 6,190,627 B1 | 2/2001 | Hoke et al. | |
| 6,213,049 B1 | 4/2001 | Yang | 118/723 |
| 6,214,195 B1 | 4/2001 | Yadav et al. | 205/334 |
| 6,228,904 B1 | 5/2001 | Yadav et al. | 523/210 |

(56) References Cited

U.S. PATENT DOCUMENTS

| | | | |
|---|---|---|---|
| 6,254,940 B1 | 7/2001 | Pratsinis et al. | 427/562 |
| 6,261,484 B1 | 7/2001 | Phillips et al. | 264/5 |
| 6,267,864 B1 | 7/2001 | Yadav et al. | 205/341 |
| 6,322,756 B1 | 11/2001 | Arno et al. | |
| 6,342,465 B1 | 1/2002 | Klein et al. | |
| 6,344,271 B1 | 2/2002 | Yadav et al. | 428/402 |
| 6,362,449 B1 | 3/2002 | Hadidi et al. | |
| 6,379,419 B1 | 4/2002 | Celik et al. | 75/346 |
| 6,387,560 B1 | 5/2002 | Yadav et al. | 429/45 |
| 6,395,214 B1 | 5/2002 | Kear et al. | 264/434 |
| 6,398,843 B1 | 6/2002 | Tarrant | 75/249 |
| 6,399,030 B1 | 6/2002 | Nolan | |
| 6,409,851 B1 | 6/2002 | Sethuram et al. | 148/565 |
| 6,413,781 B1 | 7/2002 | Geis et al. | 436/178 |
| 6,416,818 B1 | 7/2002 | Aikens et al. | 427/383.1 |
| RE37,853 E | 9/2002 | Detering et al. | 75/10.19 |
| 6,444,009 B1 | 9/2002 | Liu et al. | 75/332 |
| 6,475,951 B1 | 11/2002 | Domesle et al. | |
| 6,488,904 B1 | 12/2002 | Cox et al. | |
| 6,506,995 B1 | 1/2003 | Fusaro, Jr. et al. | |
| 6,517,800 B1 | 2/2003 | Cheng et al. | 423/447.1 |
| 6,524,662 B2 | 2/2003 | Jang et al. | 427/535 |
| 6,531,704 B2 | 3/2003 | Yadav et al. | 250/493.1 |
| 6,548,445 B1 | 4/2003 | Buysch et al. | |
| 6,554,609 B2 | 4/2003 | Yadav et al. | 432/9 |
| 6,562,304 B1 | 5/2003 | Mizrahi | |
| 6,562,495 B2 | 5/2003 | Yadav et al. | 429/12 |
| 6,569,393 B1 | 5/2003 | Hoke et al. | |
| 6,569,397 B1 | 5/2003 | Yadav et al. | 423/345 |
| 6,569,518 B2 | 5/2003 | Yadav et al. | 428/323 |
| 6,572,672 B2 | 6/2003 | Yadav et al. | 75/343 |
| 6,579,446 B1 | 6/2003 | Teran et al. | |
| 6,596,187 B2 | 7/2003 | Coll et al. | 216/56 |
| 6,603,038 B1 | 8/2003 | Hagemeyer et al. | 560/241.1 |
| 6,607,821 B2 | 8/2003 | Yadav et al. | 428/323 |
| 6,610,355 B2 | 8/2003 | Yadav et al. | 427/115 |
| 6,623,559 B2 | 9/2003 | Huang | 117/87 |
| 6,635,357 B2 | 10/2003 | Moxson et al. | 428/548 |
| 6,641,775 B2 | 11/2003 | Vigliotti et al. | 264/618 |
| 6,652,822 B2 | 11/2003 | Phillips et al. | 423/290 |
| 6,652,967 B2 | 11/2003 | Yadav et al. | 428/403 |
| 6,669,823 B1 | 12/2003 | Sarkas et al. | 204/164 |
| 6,682,002 B2 | 1/2004 | Kyotani | 239/318 |
| 6,689,192 B1 | 2/2004 | Phillips et al. | 75/342 |
| 6,699,398 B1 | 3/2004 | Kim | 216/55 |
| 6,706,097 B2 | 3/2004 | Zornes | 96/153 |
| 6,706,660 B2 | 3/2004 | Park | |
| 6,710,207 B2 | 3/2004 | Bogan, Jr. et al. | |
| 6,713,176 B2 | 3/2004 | Yadav et al. | 428/402 |
| 6,716,525 B1 | 4/2004 | Yadav et al. | 428/402 |
| 6,744,006 B2 | 6/2004 | Johnson et al. | |
| 6,746,791 B2 | 6/2004 | Yadav et al. | 429/30 |
| 6,772,584 B2 | 8/2004 | Chun et al. | 60/275 |
| 6,786,950 B2 | 9/2004 | Yadav et al. | 75/346 |
| 6,813,931 B2 | 11/2004 | Yadav et al. | 73/31.05 |
| 6,817,388 B2 | 11/2004 | Tsangaris et al. | 141/82 |
| 6,832,735 B2 | 12/2004 | Yadav et al. | 241/16 |
| 6,838,072 B1 | 1/2005 | Kong et al. | 423/594.2 |
| 6,841,509 B1 | 1/2005 | Hwang et al. | |
| 6,855,410 B2 | 2/2005 | Buckley | |
| 6,855,426 B2 | 2/2005 | Yadav | 428/403 |
| 6,855,749 B1 | 2/2005 | Yadav et al. | 523/105 |
| 6,858,170 B2 | 2/2005 | Van Thillo et al. | |
| 6,886,545 B1 | 5/2005 | Holm | 123/568.21 |
| 6,891,319 B2 | 5/2005 | Dean et al. | |
| 6,896,958 B1 | 5/2005 | Cayton et al. | 428/323 |
| 6,902,699 B2 | 6/2005 | Fritzemeier et al. | 419/38 |
| 6,916,872 B2 | 7/2005 | Yadav et al. | 524/430 |
| 6,919,065 B2 | 7/2005 | Zhou et al. | |
| 6,919,527 B2 | 7/2005 | Boulos et al. | 219/121.52 |
| 6,933,331 B2 | 8/2005 | Yadav et al. | 523/210 |
| 6,972,115 B1 | 12/2005 | Ballard | |
| 6,986,877 B2 | 1/2006 | Takikawa et al. | 423/447.3 |
| 6,994,837 B2 | 2/2006 | Boulos et al. | 423/613 |
| 7,007,872 B2 | 3/2006 | Yadav et al. | 241/1 |
| 7,022,305 B2 | 4/2006 | Drumm et al. | |
| 7,052,777 B2 | 5/2006 | Brotzman, Jr. et al. | 428/570 |
| 7,073,559 B2 | 7/2006 | O'Larey et al. | 164/76.1 |
| 7,074,364 B2 | 7/2006 | Jähn et al. | |
| 7,081,267 B2 | 7/2006 | Yadav | 427/115 |
| 7,101,819 B2 | 9/2006 | Rosenflanz et al. | 501/10 |
| 7,147,544 B2 | 12/2006 | Rosenflanz | 451/28 |
| 7,147,894 B2 | 12/2006 | Zhou et al. | 427/256 |
| 7,166,198 B2 | 1/2007 | Van Der Walt et al. | 204/165 |
| 7,166,663 B2 | 1/2007 | Cayton et al. | 524/430 |
| 7,172,649 B2 | 2/2007 | Conrad et al. | 106/35 |
| 7,172,790 B2 | 2/2007 | Koulik et al. | 427/212 |
| 7,178,747 B2 | 2/2007 | Yadav et al. | 241/23 |
| 7,208,126 B2 | 4/2007 | Musick et al. | 423/69 |
| 7,211,236 B2 | 5/2007 | Stark et al. | 423/592.1 |
| 7,217,407 B2 | 5/2007 | Zhang | 423/610 |
| 7,220,398 B2 | 5/2007 | Sutorik et al. | 423/593.1 |
| 7,255,498 B2 | 8/2007 | Bush et al. | |
| 7,265,076 B2 | 9/2007 | Taguchi et al. | |
| 7,282,167 B2 | 10/2007 | Carpenter | |
| 7,307,195 B2 | 12/2007 | Polverejan et al. | 585/443 |
| 7,323,655 B2 | 1/2008 | Kim | 219/121.43 |
| 7,384,447 B2 | 6/2008 | Kodas et al. | 75/332 |
| 7,402,899 B1 | 7/2008 | Whiting et al. | |
| 7,417,008 B2 | 8/2008 | Richards et al. | |
| 7,494,527 B2 | 2/2009 | Jurewicz et al. | 75/346 |
| 7,517,826 B2 | 4/2009 | Fujdala et al. | |
| 7,534,738 B2 | 5/2009 | Fujdala et al. | |
| 7,541,012 B2 | 6/2009 | Yeung et al. | |
| 7,541,310 B2 | 6/2009 | Espinoza et al. | |
| 7,557,324 B2 | 7/2009 | Nylen et al. | |
| 7,572,315 B2 | 8/2009 | Boulos et al. | 75/336 |
| 7,576,029 B2 | 8/2009 | Saito et al. | |
| 7,576,031 B2 | 8/2009 | Beutel et al. | |
| 7,604,843 B1 * | 10/2009 | Robinson et al. | 427/376.6 |
| 7,611,686 B2 | 11/2009 | Alekseeva et al. | 423/276 |
| 7,615,097 B2 | 11/2009 | McKechnie et al. | 75/346 |
| 7,618,919 B2 | 11/2009 | Shimazu et al. | |
| 7,622,693 B2 | 11/2009 | Foret | 219/121.43 |
| 7,632,775 B2 | 12/2009 | Zhou et al. | |
| 7,635,218 B1 | 12/2009 | Lott | |
| 7,674,744 B2 | 3/2010 | Shiratori et al. | |
| 7,678,419 B2 | 3/2010 | Kevwitch et al. | |
| 7,704,369 B2 | 4/2010 | Olah et al. | |
| 7,709,411 B2 | 5/2010 | Zhou et al. | |
| 7,709,414 B2 | 5/2010 | Fujdala et al. | |
| 7,745,367 B2 | 6/2010 | Fujdala et al. | |
| 7,750,265 B2 | 7/2010 | Belashchenko et al. | |
| 7,803,210 B2 | 9/2010 | Sekine et al. | 75/334 |
| 7,842,515 B2 | 11/2010 | Zou et al. | |
| 7,851,405 B2 | 12/2010 | Wakamatsu et al. | |
| 7,874,239 B2 | 1/2011 | Howland | |
| 7,875,573 B2 | 1/2011 | Beutel et al. | |
| 7,897,127 B2 | 3/2011 | Layman et al. | |
| 7,902,104 B2 | 3/2011 | Kalck | |
| 7,905,942 B1 | 3/2011 | Layman | |
| 7,935,655 B2 | 5/2011 | Tolmachev | |
| 8,051,724 B1 | 11/2011 | Layman et al. | |
| 8,076,258 B1 | 12/2011 | Biberger | |
| 8,080,494 B2 | 12/2011 | Yasuda et al. | |
| 8,089,495 B2 | 1/2012 | Keller | |
| 8,142,619 B2 | 3/2012 | Layman et al. | |
| 8,168,561 B2 | 5/2012 | Virkar | |
| 8,173,572 B2 | 5/2012 | Feaviour | |
| 8,211,392 B2 | 7/2012 | Grubert et al. | |
| 8,258,070 B2 | 9/2012 | Fujdala et al. | |
| 8,278,240 B2 | 10/2012 | Tange et al. | |
| 8,294,060 B2 | 10/2012 | Mohanty et al. | |
| 8,309,489 B2 | 11/2012 | Roldan Cuenya et al. | |
| 8,349,761 B2 | 1/2013 | Xia et al. | |
| 8,557,727 B2 | 10/2013 | Yin et al. | |
| 8,574,408 B2 | 11/2013 | Layman | |
| 8,669,202 B2 | 3/2014 | van den Hoek et al. | |
| 2001/0004009 A1 | 6/2001 | MacKelvie | |
| 2001/0042802 A1 | 11/2001 | Youds | 241/5 |
| 2001/0055554 A1 | 12/2001 | Hoke et al. | |
| 2002/0018815 A1 | 2/2002 | Sievers et al. | 424/489 |
| 2002/0068026 A1 | 6/2002 | Murrell et al. | 422/211 |
| 2002/0071800 A1 | 6/2002 | Hoke et al. | |

(56) References Cited

U.S. PATENT DOCUMENTS

| | | | |
|---|---|---|---|
| 2002/0079620 A1 | 6/2002 | DuBuis et al. | 264/328.14 |
| 2002/0100751 A1 | 8/2002 | Carr | 219/209 |
| 2002/0102674 A1 | 8/2002 | Anderson | 435/174 |
| 2002/0131914 A1 | 9/2002 | Sung | |
| 2002/0143417 A1 | 10/2002 | Ito et al. | |
| 2002/0168466 A1 | 11/2002 | Tapphorn et al. | |
| 2002/0182735 A1 | 12/2002 | Kibby et al. | |
| 2002/0183191 A1 | 12/2002 | Faber et al. | |
| 2002/0192129 A1 | 12/2002 | Shamouilian et al. | |
| 2003/0036786 A1 | 2/2003 | Duren et al. | 607/96 |
| 2003/0042232 A1 | 3/2003 | Shimazu | 219/121.47 |
| 2003/0047617 A1 | 3/2003 | Shanmugham et al. | |
| 2003/0066800 A1 | 4/2003 | Saim et al. | 264/5 |
| 2003/0102099 A1 | 6/2003 | Yadav et al. | |
| 2003/0108459 A1 | 6/2003 | Wu et al. | 422/186.04 |
| 2003/0110931 A1 | 6/2003 | Aghajanian et al. | |
| 2003/0129098 A1 | 7/2003 | Endo et al. | |
| 2003/0139288 A1 | 7/2003 | Cai et al. | |
| 2003/0143153 A1 | 7/2003 | Boulos et al. | |
| 2003/0172772 A1 | 9/2003 | Sethuram et al. | 501/87 |
| 2003/0223546 A1 | 12/2003 | McGregor et al. | 378/143 |
| 2004/0009118 A1 | 1/2004 | Phillips et al. | 423/592.1 |
| 2004/0023302 A1 | 2/2004 | Archibald et al. | 435/7.1 |
| 2004/0023453 A1 | 2/2004 | Xu et al. | 257/369 |
| 2004/0077494 A1 | 4/2004 | LaBarge et al. | 502/303 |
| 2004/0103751 A1 | 6/2004 | Joseph et al. | 75/10.19 |
| 2004/0109523 A1 | 6/2004 | Singh et al. | |
| 2004/0119064 A1 | 6/2004 | Narayan et al. | |
| 2004/0127586 A1 | 7/2004 | Jin et al. | |
| 2004/0129222 A1 | 7/2004 | Nylen et al. | |
| 2004/0166036 A1 | 8/2004 | Chen et al. | |
| 2004/0167009 A1 | 8/2004 | Kuntz et al. | 501/95.2 |
| 2004/0176246 A1 | 9/2004 | Shirk et al. | 502/439 |
| 2004/0208805 A1 | 10/2004 | Fincke et al. | |
| 2004/0213998 A1 | 10/2004 | Hearley et al. | 428/402 |
| 2004/0238345 A1 | 12/2004 | Koulik et al. | |
| 2004/0251017 A1 | 12/2004 | Pillion et al. | 165/289 |
| 2004/0251241 A1 | 12/2004 | Blutke et al. | |
| 2005/0000321 A1 | 1/2005 | O'Larey et al. | 75/952 |
| 2005/0000950 A1 | 1/2005 | Schroder et al. | 219/121.59 |
| 2005/0066805 A1 | 3/2005 | Park et al. | |
| 2005/0070431 A1 | 3/2005 | Alvin et al. | |
| 2005/0077034 A1 | 4/2005 | King | 165/163 |
| 2005/0097988 A1 | 5/2005 | Kodas et al. | 75/332 |
| 2005/0106865 A1 | 5/2005 | Chung et al. | |
| 2005/0133121 A1 | 6/2005 | Subramanian et al. | |
| 2005/0153069 A1 | 7/2005 | Tapphorn et al. | |
| 2005/0163673 A1 | 7/2005 | Johnson et al. | |
| 2005/0199739 A1 | 9/2005 | Kuroda et al. | 239/13 |
| 2005/0211018 A1 | 9/2005 | Jurewicz et al. | |
| 2005/0220695 A1 | 10/2005 | Abatzoglou et al. | 423/445 |
| 2005/0227864 A1 | 10/2005 | Sutorik et al. | |
| 2005/0233380 A1 | 10/2005 | Persiri et al. | 435/7.1 |
| 2005/0240069 A1 | 10/2005 | Polverejan et al. | 585/444 |
| 2005/0258766 A1 | 11/2005 | Kim | 315/111.21 |
| 2005/0275143 A1 | 12/2005 | Toth | |
| 2006/0051505 A1 | 3/2006 | Kortshagen et al. | 427/212 |
| 2006/0068989 A1 | 3/2006 | Ninomiya et al. | 502/339 |
| 2006/0094595 A1 | 5/2006 | Labarge | |
| 2006/0096393 A1 | 5/2006 | Pesiri | 73/863.21 |
| 2006/0105910 A1 | 5/2006 | Zhou et al. | 502/338 |
| 2006/0108332 A1 | 5/2006 | Belashchenko | 219/121.47 |
| 2006/0153728 A1 | 7/2006 | Schoenung et al. | 419/32 |
| 2006/0153765 A1 | 7/2006 | Pham-Huu et al. | 423/345 |
| 2006/0159596 A1 | 7/2006 | De La Veaux et al. | 422/151 |
| 2006/0166809 A1 | 7/2006 | Malek et al. | |
| 2006/0211569 A1 | 9/2006 | Dang et al. | |
| 2006/0213326 A1* | 9/2006 | Gollob et al. | 75/252 |
| 2006/0222780 A1 | 10/2006 | Gurevich et al. | |
| 2006/0231525 A1 | 10/2006 | Asakawa et al. | 216/56 |
| 2007/0044513 A1 | 3/2007 | Kear et al. | |
| 2007/0048206 A1 | 3/2007 | Hung et al. | 423/335 |
| 2007/0049484 A1 | 3/2007 | Kear et al. | |
| 2007/0063364 A1 | 3/2007 | Hsiao et al. | 264/5 |
| 2007/0084308 A1 | 4/2007 | Nakamura et al. | 75/346 |
| 2007/0084834 A1 | 4/2007 | Hanus et al. | 219/121.5 |
| 2007/0087934 A1 | 4/2007 | Martens et al. | 502/214 |
| 2007/0163385 A1 | 7/2007 | Takahashi et al. | |
| 2007/0173403 A1 | 7/2007 | Koike et al. | 502/300 |
| 2007/0178673 A1 | 8/2007 | Gole et al. | |
| 2007/0221404 A1 | 9/2007 | Das et al. | |
| 2007/0253874 A1 | 11/2007 | Foret | 422/186.07 |
| 2007/0292321 A1 | 12/2007 | Plischke et al. | 422/198 |
| 2008/0006954 A1 | 1/2008 | Yubuta et al. | |
| 2008/0026041 A1 | 1/2008 | Tepper et al. | |
| 2008/0031806 A1 | 2/2008 | Gavenonis et al. | |
| 2008/0038578 A1 | 2/2008 | Li | |
| 2008/0045405 A1 | 2/2008 | Beutel et al. | |
| 2008/0047261 A1 | 2/2008 | Han et al. | |
| 2008/0057212 A1 | 3/2008 | Dorier et al. | |
| 2008/0064769 A1 | 3/2008 | Sato et al. | |
| 2008/0104735 A1 | 5/2008 | Howland | |
| 2008/0105083 A1 | 5/2008 | Nakamura et al. | 75/255 |
| 2008/0116178 A1 | 5/2008 | Weidman | 219/121.47 |
| 2008/0125308 A1 | 5/2008 | Fujdala et al. | |
| 2008/0125313 A1 | 5/2008 | Fujdala et al. | |
| 2008/0138651 A1 | 6/2008 | Doi et al. | |
| 2008/0175936 A1 | 7/2008 | Tokita et al. | |
| 2008/0187714 A1 | 8/2008 | Wakamatsu et al. | |
| 2008/0206562 A1 | 8/2008 | Stucky et al. | |
| 2008/0207858 A1 | 8/2008 | Kowaleski et al. | 526/176 |
| 2008/0248704 A1 | 10/2008 | Mathis et al. | |
| 2008/0274344 A1 | 11/2008 | Vieth et al. | |
| 2008/0277092 A1 | 11/2008 | Layman et al. | |
| 2008/0277264 A1 | 11/2008 | Sprague | |
| 2008/0277266 A1 | 11/2008 | Layman | |
| 2008/0277267 A1 | 11/2008 | Biberger et al. | |
| 2008/0277268 A1 | 11/2008 | Layman | |
| 2008/0277269 A1 | 11/2008 | Layman et al. | |
| 2008/0277270 A1 | 11/2008 | Biberger et al. | |
| 2008/0277271 A1 | 11/2008 | Layman | |
| 2008/0280049 A1 | 11/2008 | Kevwitch et al. | |
| 2008/0280751 A1 | 11/2008 | Harutyunyan et al. | |
| 2008/0280756 A1 | 11/2008 | Biberger | |
| 2008/0283411 A1 | 11/2008 | Eastman et al. | |
| 2008/0283498 A1 | 11/2008 | Yamazaki | |
| 2009/0010801 A1 | 1/2009 | Murphy et al. | |
| 2009/0054230 A1 | 2/2009 | Veeraraghavan et al. | |
| 2009/0088585 A1 | 4/2009 | Schammel et al. | |
| 2009/0092887 A1 | 4/2009 | McGrath et al. | |
| 2009/0098402 A1 | 4/2009 | Kang et al. | |
| 2009/0114568 A1 | 5/2009 | Trevino et al. | |
| 2009/0162991 A1 | 6/2009 | Beneyton et al. | |
| 2009/0168506 A1 | 7/2009 | Han et al. | |
| 2009/0170242 A1 | 7/2009 | Lin et al. | |
| 2009/0181474 A1 | 7/2009 | Nagai | |
| 2009/0200180 A1 | 8/2009 | Capote et al. | |
| 2009/0208367 A1 | 8/2009 | Calio et al. | |
| 2009/0209408 A1 | 8/2009 | Kitamura et al. | |
| 2009/0223410 A1 | 9/2009 | Jun et al. | |
| 2009/0253037 A1 | 10/2009 | Park et al. | |
| 2009/0274897 A1 | 11/2009 | Kaner et al. | |
| 2009/0274903 A1 | 11/2009 | Addiego | |
| 2009/0286899 A1 | 11/2009 | Hofmann et al. | |
| 2009/0324468 A1 | 12/2009 | Golden et al. | |
| 2010/0089002 A1 | 4/2010 | Merkel | |
| 2010/0092358 A1 | 4/2010 | Koegel et al. | |
| 2010/0124514 A1 | 5/2010 | Chelluri et al. | |
| 2010/0166629 A1 | 7/2010 | Deeba | |
| 2010/0180581 A1 | 7/2010 | Grubert et al. | |
| 2010/0180582 A1 | 7/2010 | Mueller-Stach et al. | |
| 2010/0186375 A1 | 7/2010 | Kazi et al. | |
| 2010/0240525 A1 | 9/2010 | Golden et al. | |
| 2010/0275781 A1 | 11/2010 | Tsangaris | |
| 2011/0006463 A1 | 1/2011 | Layman | |
| 2011/0030346 A1 | 2/2011 | Neubauer et al. | |
| 2011/0052467 A1 | 3/2011 | Chase et al. | |
| 2011/0143041 A1 | 6/2011 | Layman et al. | |
| 2011/0143915 A1 | 6/2011 | Yin et al. | |
| 2011/0143916 A1 | 6/2011 | Leamon | |
| 2011/0143926 A1 | 6/2011 | Yin et al. | |
| 2011/0143930 A1 | 6/2011 | Yin et al. | |
| 2011/0143933 A1 | 6/2011 | Yin et al. | |
| 2011/0144382 A1 | 6/2011 | Yin et al. | |

(56) References Cited

U.S. PATENT DOCUMENTS

| | | | |
|---|---|---|---|
| 2011/0152550 A1 | 6/2011 | Grey et al. | |
| 2011/0158871 A1 | 6/2011 | Arnold et al. | |
| 2011/0174604 A1 | 7/2011 | Duesel et al. | |
| 2011/0243808 A1 | 10/2011 | Fossey et al. | |
| 2011/0245073 A1 | 10/2011 | Oljaca et al. | |
| 2011/0247336 A9 | 10/2011 | Farsad et al. | |
| 2011/0305612 A1 | 12/2011 | Mëller-Stach et al. | |
| 2012/0023909 A1 | 2/2012 | Lambert et al. | |
| 2012/0045373 A1 | 2/2012 | Biberger | |
| 2012/0097033 A1 | 4/2012 | Arnold et al. | |
| 2012/0122660 A1 | 5/2012 | Andersen et al. | |
| 2012/0124974 A1 | 5/2012 | Li et al. | |
| 2012/0171098 A1 | 7/2012 | Hung et al. | |
| 2012/0308467 A1 | 12/2012 | Carpenter et al. | |
| 2012/0313269 A1 | 12/2012 | Kear et al. | |
| 2013/0079216 A1 | 3/2013 | Biberger et al. | |
| 2013/0213018 A1 | 8/2013 | Yin et al. | |
| 2013/0280528 A1 | 10/2013 | Biberger | |
| 2013/0281288 A1 | 10/2013 | Biberger et al. | |
| 2013/0316896 A1 | 11/2013 | Biberger | |
| 2013/0345047 A1 | 12/2013 | Biberger et al. | |
| 2014/0018230 A1 | 1/2014 | Yin et al. | |
| 2014/0120355 A1 | 5/2014 | Biberger | |
| 2014/0128245 A1 | 5/2014 | Yin et al. | |

FOREIGN PATENT DOCUMENTS

| | | | | |
|---|---|---|---|---|
| EP | 1 256 378 A2 | 11/2002 | | |
| EP | 1 619 168 A1 | 1/2006 | | |
| EP | 1 955 765 A1 | 8/2008 | | |
| GB | 1 307 941 A | 2/1973 | | |
| JP | 56-146804 | 11/1981 | | B22F 9/08 |
| JP | 61-086815 A | 5/1986 | | |
| JP | 62-102827 A | 5/1987 | | |
| JP | 63-214342 A | 9/1988 | | |
| JP | 1-164795 A | 6/1989 | | |
| JP | 05-228361 A | 9/1993 | | |
| JP | 05-324094 A | 12/1993 | | |
| JP | 6-93309 A | 4/1994 | | |
| JP | 6-135797 A | 5/1994 | | |
| JP | 6-65772 U | 9/1994 | | |
| JP | 6-272012 A | 9/1994 | | |
| JP | 7031873 A | 2/1995 | | B01J 19/08 |
| JP | 7-256116 A | 10/1995 | | |
| JP | 8-158033 A | 6/1996 | | |
| JP | 10-130810 A | 5/1998 | | |
| JP | 11-502760 A | 3/1999 | | |
| JP | 2000-220978 A | 8/2000 | | |
| JP | 2002-88486 A | 3/2002 | | |
| JP | 2002-336688 A | 11/2002 | | |
| JP | 2003-126694 A | 5/2003 | | |
| JP | 2004-233007 A | 8/2004 | | |
| JP | 2004-249206 A | 9/2004 | | |
| JP | 2004-290730 A | 10/2004 | | |
| JP | 2005-503250 A | 2/2005 | | |
| JP | 2005-122621 A | 5/2005 | | |
| JP | 2005-218937 A | 8/2005 | | |
| JP | 2005-342615 A | 12/2005 | | |
| JP | 2006-001779 A | 1/2006 | | |
| JP | 2006-508885 A | 3/2006 | | |
| JP | 2006-247446 A | 9/2006 | | |
| JP | 2006-260385 A | 9/2006 | | |
| JP | 2007-46162 A | 2/2007 | | |
| JP | 2007-203129 A | 8/2007 | | |
| SU | 493241 | 3/1976 | | |
| TW | 200611449 A | 4/2006 | | |
| TW | 201023207 A | 6/2010 | | |
| WO | WO-96/28577 A1 | 9/1996 | | |
| WO | WO 02/092503 A1 | 11/2002 | | C01B 21/064 |
| WO | WO-03/094195 A1 | 11/2003 | | |
| WO | WO 2004/052778 A2 | 6/2004 | | C01B 13/28 |
| WO | WO-2005/063390 A1 | 7/2005 | | |
| WO | WO 2006/079213 A1 | 8/2006 | | B01J 2/04 |
| WO | WO-2007/144447 A1 | 12/2007 | | |
| WO | WO-2008/130451 A2 | 10/2008 | | |
| WO | WO-2008/130451 A3 | 10/2008 | | |
| WO | WO-2011/081833 A1 | 7/2011 | | |
| WO | WO-2012/028695 A2 | 3/2012 | | |
| WO | WO-2013/028575 A1 | 2/2013 | | |

OTHER PUBLICATIONS

Babin et al., "Sovents Used in the Arts", Copyright Center for Safety in the Arts 1985, p. 12.*
A. Gutsch et al., "Gas-Phase Production of Nanoparticles", Kona No. 20, 2002, pp. 24-37.
Dr. Heike Mühlenweg et al., "Gas-Phase Reactions—Open Up New Roads to Nanoproducts", Degussa ScienceNewsletter No. 08, 2004, pp. 12-16.
Coating Generation: Vaporization of Particles in Plasma Spraying and Splat Formation, M. Vardelle, A. Vardelle, K-I li, P. Fauchais, Universite de Limoges, 123 Avenue A. Thomas 87000, Limoges, F. , Pure & Chem, vol. 68, No. 5, pp. 1093-1099, 1996.
H. Konrad et al., "Nanostructured Cu—Bi Alloys Prepared by Co-Evaporation in a Continuous Gas Flow," NanoStructured Materials, vol. 7, No. 6, 1996, pp. 605-610.
Kenvin et al. "Supported Catalysts Prepared from Mononuclear Copper Complexes: Catalytic Properties", Journal of Catalysis, pp. 81-91, (1992).
J. Heberlein, "New Approaches in Thermal Plasma Technology", Pure Appl. Chem., vol. 74, No. 3, 2002, pp. 327-335.
M. Vardelle et al., "Experimental Investigation of Powder Vaporization in Thermal Plasma Jets," Plasma Chemistry and Plasma Processing, vol. 11, No. 2, Jun. 1991, pp. 185-201.
National Aeronautics and Space Administration, "Enthalpy", http://www.grc.nasa.gov/WWW/K-12/airplane/enthalpy.html, Nov. 23, 2009, 1 page.
P. Fauchais et al., "Plasma Spray: Study of the Coating Generation," Ceramics International, Elsevier, Amsterdam, NL, vol. 22, No. 4, Jan. 1996, pp. 295-303.
P. Fauchais et al., "Les Dépôts Par Plasma Thermique," Revue Generale De L'Electricitie, RGE. Paris, FR, No. 2, Jan. 1993, pp. 7-12.
P. Fauchais et al, "La Projection Par Plasma: Une Revue," Annales De Physique, vol. 14, No. 3, Jun. 1989, pp. 261-310.
T. Yoshida, "The Future of Thermal Plasma Processing for Coating", Pure & Appl. Chem., vol. 66, No. 6, 1994 pp. 1223-1230.
Hanet al., Deformation Mechanisms and Ductility of Nanostructured Al Alloys, Mat. Res. Soc. Symp. Proc. vol. 821, Jan. 2004, Material Research Society, http://www.mrs.org/s_mrs/bin.asp?CID=2670&DOC=FILE.PDF., 6 pages.
Nagai, Yasutaka, et al., "Sintering Inhibition Mechanism of Platinum Supported on Ceria-based Oxide and Pt-oxide-support Interaction," Journal of Catalysis 242 (2006), pp. 103-109, Jul. 3, 2006, Elsevier.
Bateman, James E. et al., "Alkylation of Porous Silicon by Direct Reaction with Alkenes and Alkynes," Angew. Chem Int. Ed., Dec. 17, 1998, 37, No. 19, pp. 2683-2685.
Langner Alexander et al., "Controlled Silicon Surface Functionalization by Alkene Hydrosilylation," J. Am. Chem. Soc., Aug. 25, 2005, 127, pp. 12798-12799.
Liu, Shu-Man et al., "Enhanced Photoluminescence from Si Nano-organosols by Functionalization with Alkenes and Their Size Evolution," Chem. Mater., Jan. 13, 2006, 18,pp. 637-642.
Fojtik, Anton, "Surface Chemistry of Luminescent Colloidal Silicon Nanoparticles," J. Phys. Chem. B., Jan. 13, 2006, pp. 1994-1998.
Li, Dejin et al., "Environmentally Responsive "Hairy" Nanoparticles: Mixed Homopolymer Brushes on Silica Nanoparticles Synthesized by Living Radical Polymerization Techniques," J.Am. Chem. Soc., Apr. 9, 2005, 127,pp. 6248-6256.
Neiner, Doinita, "Low-Temperature Solution Route to Macroscopic Amounts of Hydrogen Terminated Silicon Nanoparticles," J. Am. Chem. Soc., Aug. 5, 2006, 128, pp. 11016-11017.
Fojtik, Anton et al., "Luminescent Colloidal Silicon Particles," Chemical Physics Letters 221, Apr. 29, 1994, pp. 363-367.
Netzer, Lucy et al., "A New Approach to Construction of Artificial Monolayer Assemblies," J. Am. Chem. Soc., 1983, 105, pp. 674-676.

(56) References Cited

OTHER PUBLICATIONS

Chen, H.-S. Et al., "On the Photoluminescence of Si Nanoparticles," Mater. Phys. Mech. 4, Jul. 3, 2001, pp. 62-66.
Kwon, Young-Soon et al., "Passivation Process for Superfine Aluminum Powders Obtained by Electrical Explosion of Wires," Applied Surface Science 211, Apr. 30, 2003, pp. 57-67.
Liao, Ying-Chih et al., "Self-Assembly of Organic Monolayers on Aerosolized Silicon Nanoparticles," J.Am. Chem. Soc., Jun. 27, 2006, 128, pp. 9061-9065.
Zou, Jing et al., "Solution Synthesis of Ultrastable Luminescent Siloxane-Coated Silicon Nanoparticles," Nano Letters, Jun. 4, 2004, vol. 4, No. 7, pp. 1181-1186.
Tao, Yu-Tai, "Structural Comparison of Self-Assembled Monolayers of n-Alkanoic Acids on the surfaces of Silver, Copper, and Aluminum," J. Am. Chem. Soc., May 1993, 115, pp. 4350-4358.
Sailor, Michael et al., "Surface Chemistry of Luminescent Silicon Nanocrystallites," Adv. Mater, 1997, 9, No. 10, pp. 783-793.
Li, Xuegeng et al., "Surface Functionalization of Silicon Nanoparticles Produced by Laser-Driven Pyrolysis of Silane Followed by HF-HNO3 Etching," Langmuir, May 25, 2004, pp. 4720-4727.
Carrot, Geraldine et al., "Surface-Initiated Ring-Opening Polymerization: A Versatile Method for Nanoparticle Ordering," Macromolecules, Sep. 17, 2002, 35, pp. 8400-8404.
Jouet, R. Jason et al., "Surface Passivation of Bare Aluminum Nanoparticles Using Perfluoroalkyl Carboxylic Acids," Chem. Mater., Jan. 25, 2005, 17, pp. 2987-2996.
Yoshida, Toyonobu, "The Future of Thermal Plasma Processing for Coating," Pure & Appl. Chem., vol. 66, No. 6, 1994, pp. 1223-1230.
Kim, Namyong Y. et al., "Thermal Derivatization of Porous Silicon with Alcohols," J. Am. Chem. Soc., Mar. 5, 1997, 119, pp. 2297-2298.
Hua, Fengjun et al., "Organically Capped Silicon Nanoparticles with Blue Photoluminescence Prepared by Hydrosilylation Followed by Oxidation," Langmuir, Mar. 2006, pp. 4363-4370.
Faber, K. T. et al. (Sep. 1988). "Toughening by Stress-Induced Microcracking in Two-Phase Ceramics," Communications of the American Ceramic Society 71(9): C-399-C401.
Ji, Y. et al. (Nov. 2002) "Processing and Mechanical Properties of Al2O3-5 vol.% Cr Nanocomposites," Journal of the European Ceramic Society 22(12):1927-1936.
"Platinum Group Metals: Annual Review 1996" (Oct. 1997). Engineering and Mining Journal, p. 63.
Rahaman, R. A. et al. (1995). "Synthesis of Powders," in Ceramic Processing and Sintering. Marcel Decker, Inc., New York, pp. 71-77.
Stiles, A. B. (Jan. 1, 1987). "Manufacture of Carbon-Supported Metal Catalysts," in Catalyst Supports and Supported Catalysts, Butterworth Publishers, MA, pp. 125-132.
Subramanian, S. et al. (1991). "Structure and Activity of Composite Oxide Supported Platinum-Iridium Catalysts," Applied Catalysts 74: 65-81.
Ünal, N. et al. (Nov. 2011). "Influence of WC Particles on the Microstructural and Mechanical Properties of 3 mol% Y2O3 Stabilized ZrO2 Matrix Composites Produced by Hot Pressing," Journal of the European Ceramic Society (31)13: 2267-2275.
U.S. Appl. No. 13/291,983, filed Nov. 8, 2011, for Layman et al.
U.S. Appl. No. 12/152,084, filed May 9, 2008, for Biberger.
U.S. Appl. No. 13/028,693, filed Feb. 16, 2011, for Biberger.
U.S. Appl. No. 12/943,909, filed Nov. 10, 2010, for Layman.
U.S. Appl. No. 12/152,111, filed May 9, 2008, for Biberger et al.
U.S. Appl. No. 12/151,830, filed May 8, 2008, for Biberger et al.
U.S. Appl. No. 12/968,248, filed Dec. 14, 2010, for Biberger.
U.S. Appl. No. 12/968,245, filed Dec. 14, 2010, for Biberger.
U.S. Appl. No. 12/968,241, filed Dec. 14, 2010, for Biberger.
U.S. Appl. No. 12/968,239, filed Dec. 14, 2010, for Biberger.
U.S. Appl. No. 12/969,128, filed Dec. 15, 2010, for Biberger.
U.S. Appl. No. 12/961,030, filed Dec. 6, 2010, for Lehman.
U.S. Appl. No. 12/961,108, filed Dec. 6, 2010, for Lehman.
U.S. Appl. No. 12/961,200, filed Dec. 6, 2010, for Lehman.
U.S. Appl. No. 12/968,253, filed Dec. 14, 2010, for Biberger.
U.S. Appl. No. 12/968,235, filed Dec. 14, 2010, for Biberger.
U.S. Appl. No. 12/969,306, filed Dec. 15, 2010, for Lehman et al.
U.S. Appl. No. 12/969,447, filed Dec. 15, 2010, for Biberger et al.
U.S. Appl. No. 12/969,087, filed Dec. 15, 2010, for Biberger.
U.S. Appl. No. 12/962,533, filed Dec. 7, 2010, for Yin et al.
U.S. Appl. No. 12/962,523, filed Dec. 7, 2010, for Yin et al.
U.S. Appl. No. 12/001,643, filed Dec. 11, 2007, for Biberger et al.
U.S. Appl. No. 12/474,081, filed May 28, 2009, for Biberger et al.
U.S. Appl. No. 12/001,602, filed Dec. 11, 2007, for Biberger et al.
U.S. Appl. No. 12/001,644, filed Dec. 11, 2007, for Biberger et al.
U.S. Appl. No. 12/969,457, filed Nov. 15, 2010, for Leamon et al.
U.S. Appl. No. 12/969,503, filed Nov. 15, 2010, for Leamon et al.
U.S. Appl. No. 12/954,813, filed Nov. 26, 2010, for Biberger.
U.S. Appl. No. 12/954,822, filed Nov. 26, 2010, for Biberger.
U.S. Appl. No. 13/033,514, filed Feb. 23, 2011, for Biberger et al.
U.S. Appl. No. 13/589,024, filed Aug. 17, 2012, for Yin et al.
U.S. Appl. No. 13/801,726, filed Mar. 13, 2013, for Qi et al.
Derwent English Abstract for publication No. SU 193241 A, Application No. 1973SU1943286 filed on Jul. 2, 1973, published on Mar. 1, 1976, entitled "Catalyst for Ammonia Synthesis Contains Oxides of Aluminium, Potassium, Calcium, Iron and Nickel Oxide for Increased Activity," 3 pgs.
Chen, W.-J. et al. (Mar. 18, 2008). "Functional $Fe_3O_4/TiO_2$ Core/Shell Magnetic Nanoparticles as Photokilling Agents for Pathogenic Bacteria," Small 4(4): 485-491.
Gangeri, M. et al. (2009). "Fe and Pt Carbon Nanotubes for the Electrocatalytic Conversion of Carbon Dioxide to Oxygenates," Catalysis Today 143: 57-63.
Luo, J. et al. (2008). "Core/Shell Nanoparticles as Electrocatalysts for Fuel Cell Reactions," Advanced Materials 20: 4342-4347.
Mignard, D. et al. (2003). "Methanol Synthesis from Flue-Gas $CO_2$ and Renewable Electricity: A Feasibility Study," International Journal of Hydrogen Energy 28: 455-464.
Park, H.-Y. et al. (May 30, 2007). "Fabrication of Magnetic Core@Shell Fe Oxide@Au Nanoparticles for Interfacial Bioactivity and Bio-Separation," Langmuir 23: 9050-9056.
Park, N.-G. et al. (Feb. 17, 2004). "Morphological and Photoelectrochemical Characterization of Core-Shell Nanoparticle Films for Dye-Sensitized Solar Cells: Zn-O Type Shell on $SnO_2$ and $TiO_2$ Cores," Langmuir 20: 4246-4253.
Chaim, R. et al. (2009). "Densification of Nanocrystalline $Y_2O_3$ Ceramic Powder by Spark Plasma Sintering," Journal of European Ceramic Society 29: 91-98.
Das, N. et al. (2001). "Influence of the Metal Function in the "One-Pot" Synthesis of 4-Methyl-2-Pentanone (Methyl Isobutyl Ketone) from Acetone Over Palladium Supported on Mg(Al)O Mixed Oxides Catalysts," Catalysis Letters 71(3-4): 181-185.
Lakis, R. E. et al. (1995). "Alumina-Supported Pt-Rh Catalysts: I. Microstructural Characterization," Journal of Catalysis 154: 261-275.
Schimpf, S. et al. (2002). "Supported Gold Nanoparticles: In-Depth Catalyst Characterization and Application in Hydrogenation and Oxidation Reactions," Catalysis Today 2592: 1-16.
Viswanathan, V. et al. (2006). "Challenges and Advances in Nanocomposite Processing Techniques," Materials Science and Engineering R 54: 121-285.

* cited by examiner

POWDER TREATMENT FOR ENHANCED FLOWABILITY

CROSS-REFERENCE TO RELATED APPLICATIONS

This application claims priority to U.S. Provisional Patent Application Ser. No. 61/284,329, filed Dec. 15, 2009 and entitled "MATERIALS PROCESSING," which is hereby incorporated herein by reference in its entirety as if set forth herein.

FIELD OF THE INVENTION

The present invention relates generally to the field of powder material production. More specifically, the present invention relates to a process for enhancing the flowability of powder materials.

BACKGROUND OF THE INVENTION

This disclosure refers to both particles and powders. These two terms are equivalent, except for the caveat that a singular "powder" refers to a collection of particles. The present invention may apply to a wide variety of powders and particles. Powders that fall within the scope of the present invention may include, but are not limited to, any of the following: (a) nano-structured powders(nano-powders), having an average grain size less than 250 nanometers and an aspect ratio between one and one million; (b) submicron powders, having an average grain size less than 1 micron and an aspect ratio between one and one million; (c) ultra-fine powders, having an average grain size less than 100 microns and an aspect ratio between one and one million; and (d) fine powders, having an average grain size less than 500 microns and an aspect ratio between one and one million.

Powders may be used in a wide variety of applications. In preparation for their respective applications, powders can be operated on by a plasma arc chamber. In one embodiment, the plasma arc chamber comprises two spaced apart electrodes. Working gas flows through the chamber. When current is passed across the gap between the two electrodes, the current energizes the working gas and forms a plasma arc.

FIGS. 1-2 illustrate one embodiment of a general work flow 100 and a simplified system 200 for operating on a powder using a plasma arc chamber. System 200 is presented for illustrative purposes only and is not intended to limit the present invention with respect to size and shape beyond the scope of the claims. Powder is provided by a powder supply 204. For example, the powder can be provided by a cannister of powder. At step 104, the powder is fluidized, such as by means of an introduction gas. At step 106, the fluidized powder then flows through a conduit 206, such as a hose, and into the plasma arc chamber 208. At step 108, the powder is operated on by the plasma arc chamber. Such operation preferably includes a plasma arc being generated by the plasma arc chamber and vaporizing the powder. This vaporization can be used for a variety of different applications, including, but not limited to, nano-sizing the powder, coating the powder, and applying the powder as a coating.

However, problems can arise in flowing the powder through the conduit into the plasma arc chamber. Inter-particle forces between the particles can cause attraction and agglomeration of the particles, making the powder difficult to flow and leading to an inconsistent feed. As a result, the powder is not provided with sufficient control and uniformity.

What is needed in the art is a process for modulating the inter-particle forces between the powder particles in order to enhance the powder's flowability.

SUMMARY OF THE INVENTION

The present invention provides a process for enhancing the flowability of powder material prior to introduction into the plasma arc chamber. This enhancement is achieved by substantially decreasing the inter-particle forces between each particle, thereby reducing the risk of agglomeration.

In one embodiment, a method of enhancing the flowability of a powder is disclosed where the powder is defined by a plurality of particles having an initial level of inter-particle forces between each particle. The powder is treated such that the level of inter-particle forces between each particle is substantially decreased from the initial level. The treated powder is then fluidized and flowed into a plasma arc chamber. The plasma arc chamber generates a plasma arc, and the plasma arc chamber operates on the treated powder using the generated plasma arc.

Preferably, the inter-particle forces are decreased by coating the particles with an organic surfactant. The selection of the coating material depends on the makeup of the powder particles. In a preferred embodiment, non-oxide powder can be coated with sorbitan monooleate, whereas oxide powder can be coated with a material selected from the group consisting of trialkoxysilane, alkyltrialkoxysilane, trialkylalkoxysilane, trialkyldimethylaminosilane, trialkylchlorosilane, and octyltriethoxysilane.

The particles may be coated in a variety of ways. However, in a preferred embodiment, the powder is disposed in a solvent that contains the coating material. The combination of the powder and the solvent can be agitated in order to facilitate the attachment of the coating material to each particle. The remaining solvent is then separated from the coated powder, such as by means of decanting. At this point, the powder can be dried by applying heat to the particles. Additionally, a vacuum pressure may be applied to the particles in order to help remove any of the excess solvent.

DETAILED DESCRIPTION OF THE INVENTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

Figure 3:
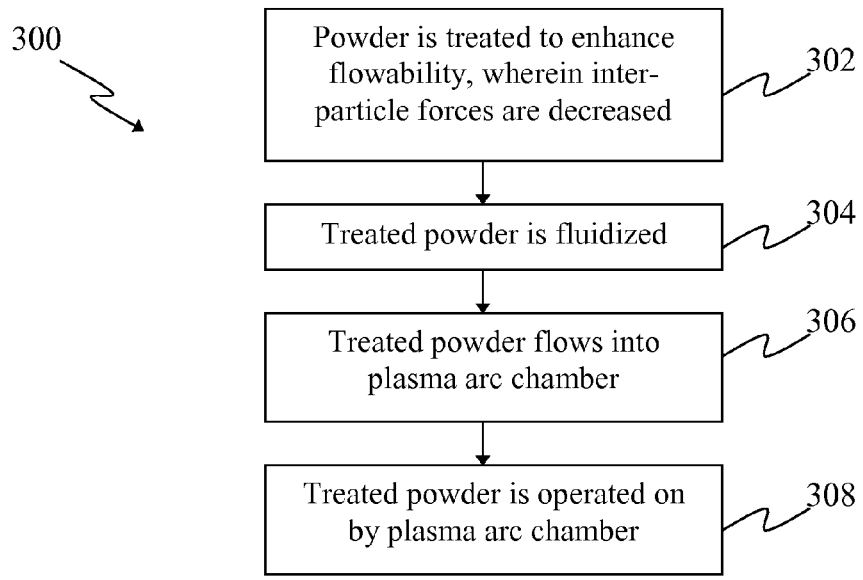
FIG. 3 is a flowchart illustrating one embodiment of a general work flow for operating on a treated powder using a plasma arc chamber in accordance with the principles of the present invention.

FIG. 3 is a flowchart illustrating one embodiment of a general work flow 300 for operating on a treated powder using a plasma arc chamber in accordance with the principles of the present invention. The powder is defined by a plurality of particles having an initial level of inter-particle forces between each particle. These inter-particle forces create an attraction between the particles which can lead to agglomeration.

At step 302, the powder is treated such that the level of inter-particle forces between each particle is substantially decreased from the initial level. In a preferred embodiment, the level of inter-particle forces is decreased to a negligible level. However, it is contemplated that a minimal amount of inter-particle forces can still exist even after the treatment. While a variety of procedures may be employed to decrease the level of inter-particle forces, a preferred embodiment will be discussed below with respect to FIG. 4.

At step 304, the treated powder is fluidized. This fluidization can be achieved in a variety of ways. In a preferred embodiment, a gas is introduced in order to suspend the particles in air. For example, an introduction gas can be injected into a cannister holding the treated powder.

Figure 1:
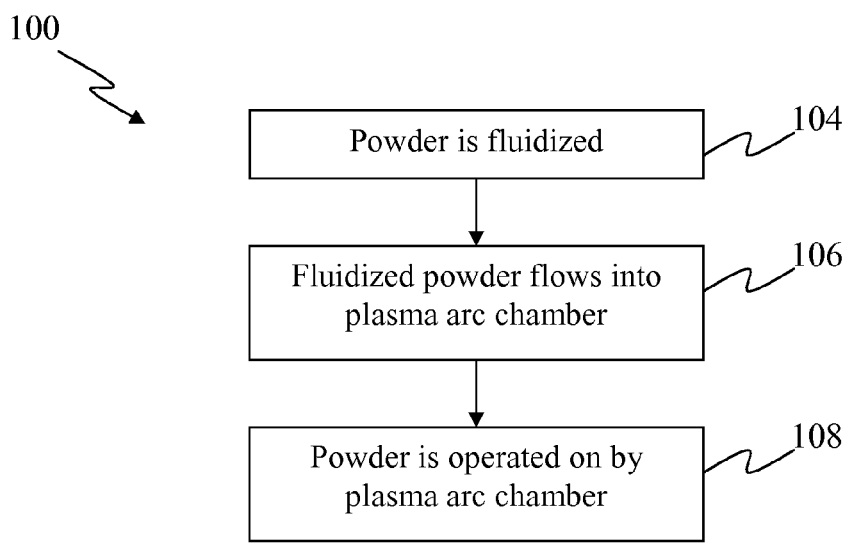
FIG. 1 is a flowchart illustrating a general work flow for operating on a powder using a plasma arc chamber.
Figure 2:
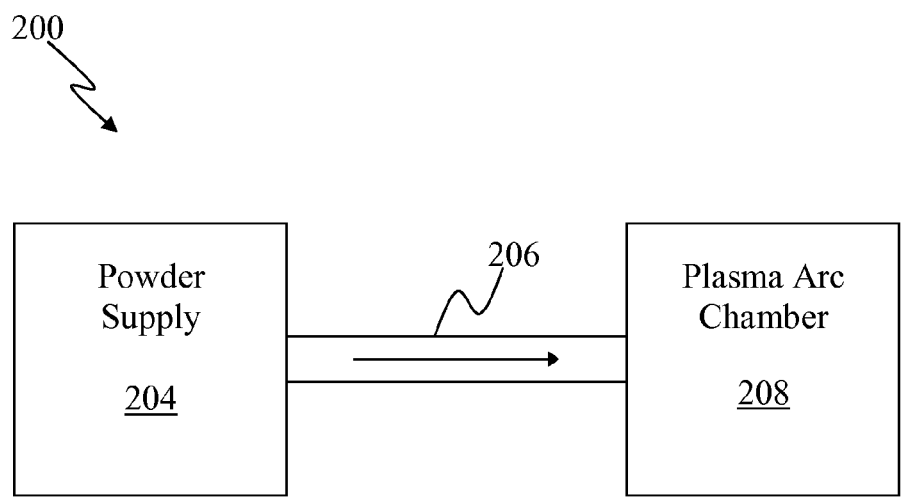
FIG. 2 is a simplified block diagram illustrating a system for operating on a powder using a plasma arc chamber.

At step 306, the treated powder is then flowed into a plasma arc chamber, preferably through a conduit. In this fashion, the process 300 can use the same basic system illustrated in FIG. 2. In this case, the powder supply 204 would contain the treated powder, which would then flow through the conduit 206 and into the plasma arc chamber 208.

At step 308, the plasma arc chamber generates a plasma arc and operates on the treated powder using the generated plasma arc. This operation on the treated powder preferably includes the plasma arc vaporizing the powder. Such vaporization can be used for nano-sizing the powder, coating the powder, applying the powder as a coating, and a variety of other applications as well.

Figure 4:
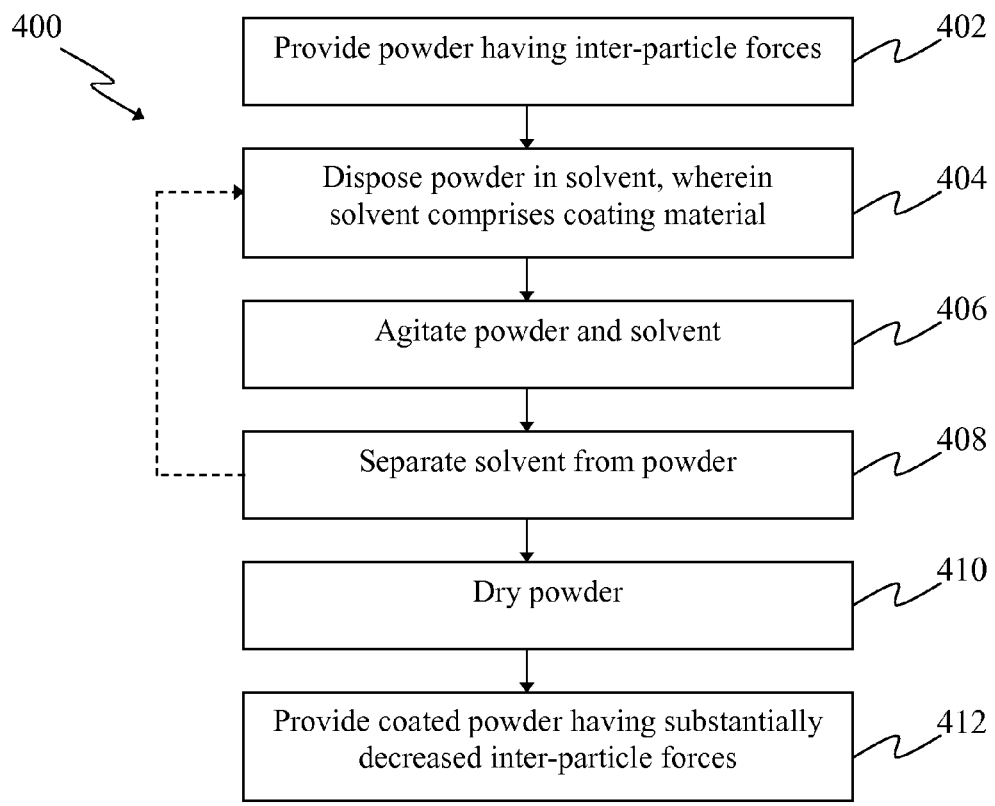
FIG. 4 is a flowchart illustrating one embodiment of a general work flow for enhancing the flowability of a powder in accordance with the principles of the present invention.

As mentioned above, the flowability of the powder can be enhanced in a variety of ways. In a preferred embodiment, each particle is coated with a coating material in order to substantially decrease the inter-particle forces attracting the particles to one another. FIG. 4 is a flowchart illustrating one embodiment of a general work flow 400 for enhancing the flowability of a powder by coating the particles with a coating material.

At step 402, the powder is provided as a plurality of particles having an initial level of inter-particle forces between each particle. The process of the present invention can apply to various types of particles, including oxides and non-oxides.

At step 404, the powder is disposed in a solvent, preferably within a container. The solvent comprises a coating material. In a preferred embodiment, the coating material is organic and is a surfactant. The specific chemical makeup of the coating material depends on the chemical makeup of the powder particles. For non-oxide particles, such as borides, carbides, nitrides, and bare metals, sorbitan monooleate is preferably used as the coating material. For oxide particles, such as silica, the coating material is preferably selected from the group consisting of trialkoxysilane, alkyltrialkoxysilane, trialkylalkoxysilane, trialkyldimethylaminosilane, and trialkylchlorosilane. Octyltriethoxysilane can also be used to coat oxide particles and works particularly well with $Y_2O_3$. However, it is contemplated that a variety of other coating materials may be used for either oxide or non-oxide particles. While different concentrations of the coating material can be employed, the coating material preferably accounts for a small percentage of the solvent, while the rest of the solvent is formed from solvent materials known in the art, such as water, alcohols (ethanol, methanol, etc.) and hydrocarbons (toluene, cyclohexane, etc.). In a preferred embodiment, the solvent comprises approximately 1% coating material. The coating material can be used to determine the rest of the solvent. For instance, hydrocarbons work particularly well with sorbitan monooleate in coating non-oxide particles.

At step 406, the powder and the solvent are agitated in order to facilitate the attachment of the coating material to each particle. In one embodiment, this agitation includes stirring the powder and the solvent for approximately 1 to 60 minutes at a temperature between approximately room temperature and 80 degrees Celsius. Since the powder has a lot of surface area and the coating material is preferably a surface active agent, a portion of the coating material migrates to the particle surface in a spontaneous process in order to decrease the energy of that interface. While the coating material preferably surrounds the entire particle, it is contemplated that the coating could only cover a portion or portions of the particle and still achieve the objective of the present invention.

At step 408, substantially all of the remaining solvent is separated from the coated powder. The remaining solvent is any portion of the solvent that has not attached to the particles to form a coating. While preferably all of this remaining solvent is removed, a minimal amount may still be left over. In one embodiment, separating the solvent involves decanting the solvent from the container, thereby leaving behind a wet coated powder.

The powder can be washed in the solvent multiple times in order to ensure sufficient coating. For example, the process may repeat at step 404, where the powder is once again disposed in the solvent containing the coating material.

After sufficient washing with the solvent, the powder can be dried at step 410. Heat can be applied to the particles. In one embodiment, the powder is dried at approximately 150 degrees Fahrenheit for about an hour. Mechanical agitation, such as stirring, may be incorporated into the drying process. Additionally, a slight vacuum pressure may be applied to the particles in order to help in removing any of the excess solvent and drying out the coating.

Optionally, the coated powder can be placed with ball bearings in a tumbling dryer with a heating element. The application of this mechanical agitation along with the heating element helps avoid clumping of the particles.

Finally, at step 412, the coated powder is provided having substantially decreased inter-particle forces between each particle. The coating material serves to decrease the inter-particle forces, thereby improving the flow characteristics of the powder.

When the coated particles are vaporized by the plasma arc, the coating material preferably transfers to a gas, thereby separating from the powder particle. In a preferred embodiment, organic materials are used for the coating material because they stand the best chance of being transferred into gases that can be carried away by the flow of gas through the system. On the other hand, heavy alloys, such as silica, are preferably avoided.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made in the embodiment chosen for illustration without departing from the spirit and scope of the invention as defined by the claims.

What is claimed is:

1. A method of enhancing the flowability of a powder to produce nanoparticles, the powder defined by a plurality of particles having an initial level of inter-particle forces between each particle, the method comprising:

coating the powder with an organic material, wherein the level of inter-particle forces between each particle is substantially decreased from the initial level;

fluidizing the coated powder;

flowing the coated powder into a plasma arc chamber;

the plasma arc chamber generating a plasma arc;

the generated plasma arc vaporizing the coated powder in order to nano-size the powder to produce nanoparticles.

2. The method of claim 1, wherein the organic material is a surfactant.

3. The method of claim 2, wherein the surfactant is sorbitan monooleate.

4. The method of claim 3, wherein each particle in the plurality of particles is a non-oxide.

5. The method of claim 1, wherein each particle in the plurality of particles is an oxide and the organic material is a material selected from the group consisting of trialkoxysilane, alkyltrialkoxysilane, trialkylalkoxysilane, trialkyldimethylaminosilane, trialkylchlorosilane, and octyltriethoxysilane.

6. The method of claim 1, wherein coating the powder comprises:

disposing the powder in a solvent within a container, wherein the solvent comprises the organic material;

agitating the combination of the powder and the solvent in the container;

coating the plurality of particles with the organic material; and separating substantially all of the remaining solvent from the coated powder.

7. The method of claim 6, wherein the organic material is a surfactant.

8. The method of claim 7, wherein the surfactant is sorbitan monooleate.

9. The method of claim 8, wherein each particle in the plurality of particles is a non-oxide.

10. The method of claim 8, wherein the solvent further comprises a hydrocarbon.

11. The method of claim 10, wherein the hydrocarbon is toluene.

12. The method of claim 10, wherein the hydrocarbon is cyclohexane.

13. The method of claim 6, wherein each particle in the plurality of particles is an oxide and the organic material is a material selected from the group consisting of trialkoxysilane, alkyltrialkoxysilane, trialkylalkoxysilane, trialkyldimethylaminosilane, trialkylchlorosilane, and octyltriethoxysilane.

14. The method of claim 6, wherein separating substantially all of the solvent from the coated powder comprises decanting substantially all of the remaining solvent from the container.

15. The method of claim 14, further comprising the step of drying the coated powder.

16. The method of claim 15, wherein the step of drying comprises applying heat and vacuum pressure to the coated powder.

17. A method of enhancing the flowability of a powder to produce nanoparticles, the powder defined by a plurality of particles having an initial level of inter-particle forces between each particle, the method comprising:

disposing the powder in a solvent within a container, wherein the solvent comprises an organic material;

coating the plurality of particles with the organic material;

separating substantially all of the remaining solvent from the coated powder, wherein the level of inter-particle forces between each particle is substantially decreased from the initial level;

fluidizing the coated powder;

flowing the coated powder into a plasma arc chamber;

the plasma arc chamber generating a plasma arc;

the generated plasma arc vaporizing the coated powder; and in order to nano-size the powder to produce nanoparticles.

18. The method of claim 17, wherein the organic material is a surfactant.

19. The method of claim 18, wherein the surfactant is sorbitan monooleate.

20. The method of claim 19, wherein the solvent further comprises a hydrocarbon.

21. The method of claim 20, wherein the hydrocarbon is toluene.

22. The method of claim 20, wherein the hydrocarbon is cyclohexane.

23. The method of claim 19, wherein each particle in the plurality of particles is a non-oxide.

24. The method of claim 17, wherein each particle in the plurality of particles is an oxide and the organic material is a material selected from the group consisting of trialkoxysilane, alkyltrialkoxysilane, trialkylalkoxysilane, trialkyldimethylaminosilane, trialkylchlorosilane, and octyltriethoxysilane.

25. The method of claim 17, wherein separating substantially all of the remaining solvent from the coated powder comprises decanting substantially all of the solvent from the container.

26. The method of claim 25, further comprising the step of drying the coated powder.

27. The method of claim 26, wherein the step of drying comprises applying heat and vacuum pressure to the coated powder.

* * * * *